(12) United States Patent
Au et al.

(10) Patent No.: US 8,400,224 B1
(45) Date of Patent: Mar. 19, 2013

(54) PROGRAMMABLE LOW NOISE AMPLIFIER AND METHODS FOR USE THEREWITH

(75) Inventors: Stephen Au, San Diego, CA (US); Long Bu, San Diego, CA (US); Dandan Li, San Diego, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/329,294

(22) Filed: Dec. 18, 2011

Related U.S. Application Data

(60) Provisional application No. 61/552,835, filed on Oct. 28, 2011.

(51) Int. Cl.
*H03F 1/22* (2006.01)

(52) U.S. Cl. ........................................ 330/311; 330/278

(58) Field of Classification Search .................. 330/277, 330/278, 311
See application file for complete search history.

(56) References Cited

U.S. PATENT DOCUMENTS

| | | | |
|---|---|---|---|
| 6,424,222 B1* | 7/2002 | Jeong et al. | 330/278 |
| 7,786,807 B1* | 8/2010 | Li et al. | 330/311 |
| 8,031,005 B2* | 10/2011 | Xiong et al. | 330/311 |
| 8,217,720 B2* | 7/2012 | Chan | 330/254 |
| 2008/0113682 A1* | 5/2008 | Park et al. | 455/552.1 |
| 2009/0174481 A1* | 7/2009 | Chang | 330/311 |

* cited by examiner

*Primary Examiner* — Khanh V Nguyen
(74) *Attorney, Agent, or Firm* — Garlick & Markison; Bruce E. Stuckman

(57) ABSTRACT

A low noise amplifier includes a programmable input stage, having a first gain that is programmable based on a first control signal. A programmable cascode stage, has a second gain that is programmable based on a second control signal. A programmable resistor stage controls the quality of a resonant tank circuit, based on a third control signal.

12 Claims, 9 Drawing Sheets

PROGRAMMABLE LOW NOISE AMPLIFIER AND METHODS FOR USE THEREWITH

CROSS REFERENCE TO RELATED PATENTS

The present application claims priority based on 35 U.S.C. §119 to the provisionally filed application entitled, LOCAL AREA NETWORK TRANSCEIVER AND METHODS FOR USE THEREWITH, having Ser. No. 61/552,835, filed on Oct. 28, 2011, the contents of which are incorporated herein for any and all purposes, by reference thereto.

STATEMENT REGARDING FEDERALLY SPONSORED RESEARCH OR DEVELOPMENT

INCORPORATION-BY-REFERENCE OF MATERIAL SUBMITTED ON A COMPACT DISC

NOT APPLICABLE

BACKGROUND OF THE INVENTION

1. Technical Field of the Invention

This invention relates generally to wireless communication and more particularly to antennas used to support wireless communications.

2. Description of Related Art

Communication systems are known to support wireless and wireline communications between wireless and/or wireline communication devices. Such communication systems range from national and/or international cellular telephone systems to the Internet to point-to-point in-home wireless networks to radio frequency identification (RFID) systems. Each type of communication system is constructed, and hence operates, in accordance with one or more communication standards. For instance, wireless communication systems may operate in accordance with one or more standards including, but not limited to, RFID, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, RFID reader, RFID tag, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver is coupled to the antenna and includes a low noise amplifier, one or more intermediate frequency stages, a filtering stage, and a data recovery stage. The low noise amplifier receives inbound RF signals via the antenna and amplifies then. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

As is also known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

Currently, wireless communications occur within licensed or unlicensed frequency spectrums. For example, wireless local area network (WLAN) communications occur within the unlicensed Industrial, Scientific, and Medical (ISM) frequency spectrum of 900 MHz, 2.4 GHz, and 5 GHz. While the ISM frequency spectrum is unlicensed there are restrictions on power, modulation techniques, and antenna gain. Another unlicensed frequency spectrum is the V-band of 55-64 GHz.

Other disadvantages of conventional approaches will be evident to one skilled in the art when presented the disclosure that follows.

BRIEF SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWING(S)

DETAILED DESCRIPTION OF THE INVENTION

Figure 1:
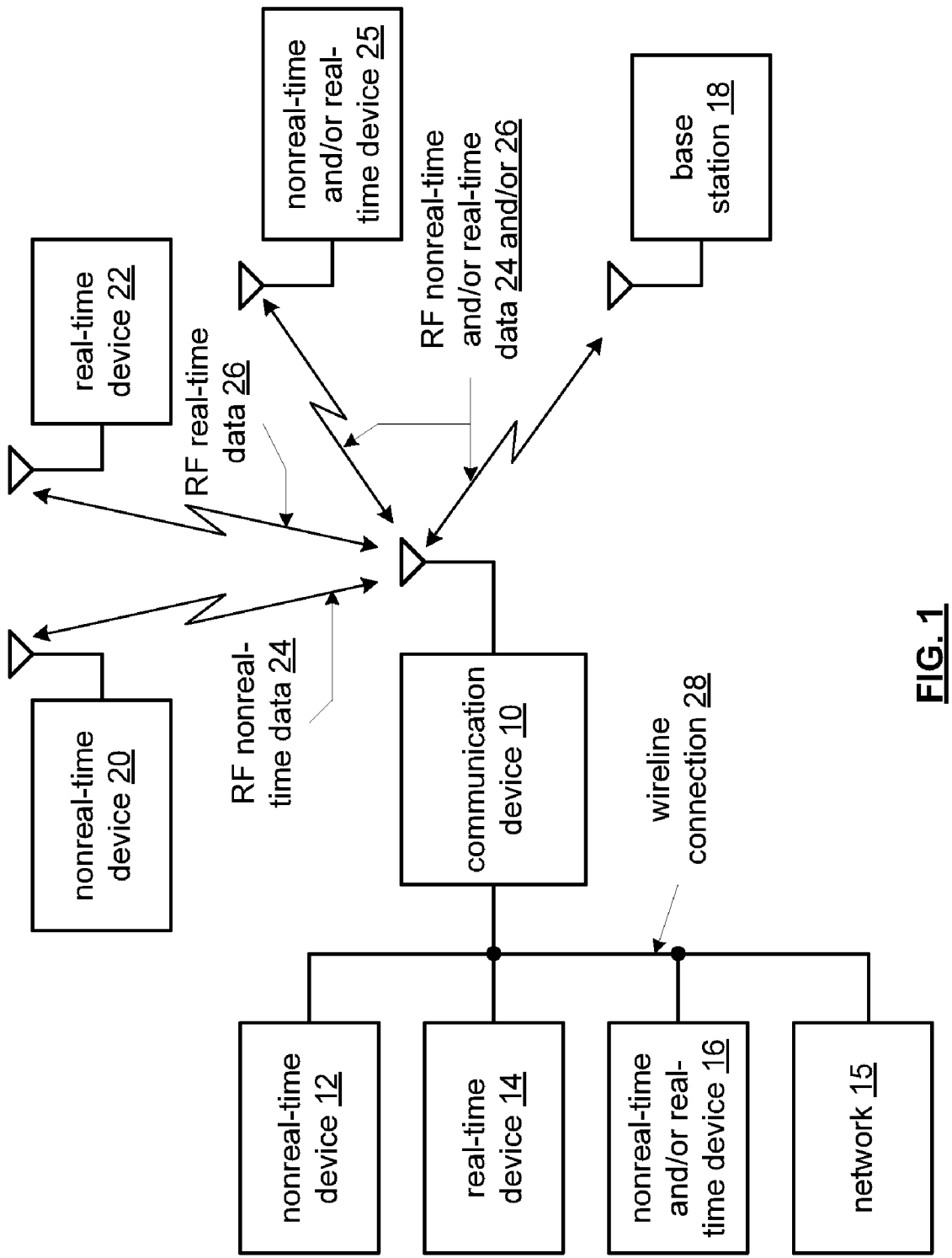
FIG. 1 is a schematic block diagram of an embodiment of a wireless communication system in accordance with the present invention.

FIG. 1 is a schematic block diagram of an embodiment of a communication system in accordance with the present invention. In particular a communication system is shown that includes a communication device 10 that communicates real-time data 24 and/or non-real-time data 26 wirelessly with one or more other devices such as base station 18, non-real-time device 20, real-time device 22, and non-real-time and/or real-time device 25. In addition, communication device 10 can also optionally communicate over a wireline connection with network 15, non-real-time device 12, real-time device 14, non-real-time and/or real-time device 16.

In an embodiment of the present invention the wireline connection 28 can be a wired connection that operates in accordance with one or more standard protocols, such as a universal serial bus (USB), Institute of Electrical and Electronics Engineers (IEEE) 488, IEEE 1394 (Firewire), Ethernet, small computer system interface (SCSI), serial or parallel advanced technology attachment (SATA or PATA), or other wired communication protocol, either standard or proprietary. The wireless connection can communicate in accordance with a wireless network protocol such as WiHD, NGMS, IEEE 802.11a, ac, b, g, n, or other 802.11 standard protocol, Bluetooth, Ultra-Wideband (UWB), WIMAX, or other wireless network protocol, a wireless telephony data/voice protocol such as Global System for Mobile Communications (GSM), General Packet Radio Service (GPRS), Enhanced Data Rates for Global Evolution (EDGE), Personal Communication Services (PCS), or other mobile wireless protocol or other wireless communication protocol, either standard or proprietary. Further, the wireless communication path can include separate transmit and receive paths that use separate carrier frequencies and/or separate frequency channels. Alternatively, a single frequency or frequency channel can be used to bi-directionally communicate data to and from the communication device 10.

Communication device 10 can be a mobile phone such as a cellular telephone, a local area network device, personal area network device or other wireless network device, a personal digital assistant, game console, personal computer, laptop computer, or other device that performs one or more functions that include communication of voice and/or data via wireline connection 28 and/or the wireless communication path. Further communication device 10 can be an access point, base station or other network access device that is coupled to a network 15 such at the Internet or other wide area network, either public or private, via wireline connection 28. In an embodiment of the present invention, the real-time and non-real-time devices 12, 14 16, 18, 20, 22 and 25 can be personal computers, laptops, PDAs, mobile phones, such as cellular telephones, devices equipped with wireless local area network or Bluetooth transceivers, FM tuners, TV tuners, digital cameras, digital camcorders, or other devices that either produce, process or use audio, video signals or other data or communications.

In operation, the communication device includes one or more applications that include voice communications such as standard telephony applications, voice-over-Internet Protocol (VoIP) applications, local gaming, Internet gaming, email, instant messaging, multimedia messaging, web browsing, audio/video recording, audio/video playback, audio/video downloading, playing of streaming audio/video, office applications such as databases, spreadsheets, word processing, presentation creation and processing and other voice and data applications. In conjunction with these applications, the real-time data 26 includes voice, audio, video and multimedia applications including Internet gaming, etc. The non-real-time data 24 includes text messaging, email, web browsing, file uploading and downloading, etc.

In an embodiment of the present invention, the communication device 10 includes a wireless transceiver that includes one or more features or functions of the present invention. Such wireless transceivers shall be described in greater detail in association with FIGS. 3-9 that follow.

Figure 2:
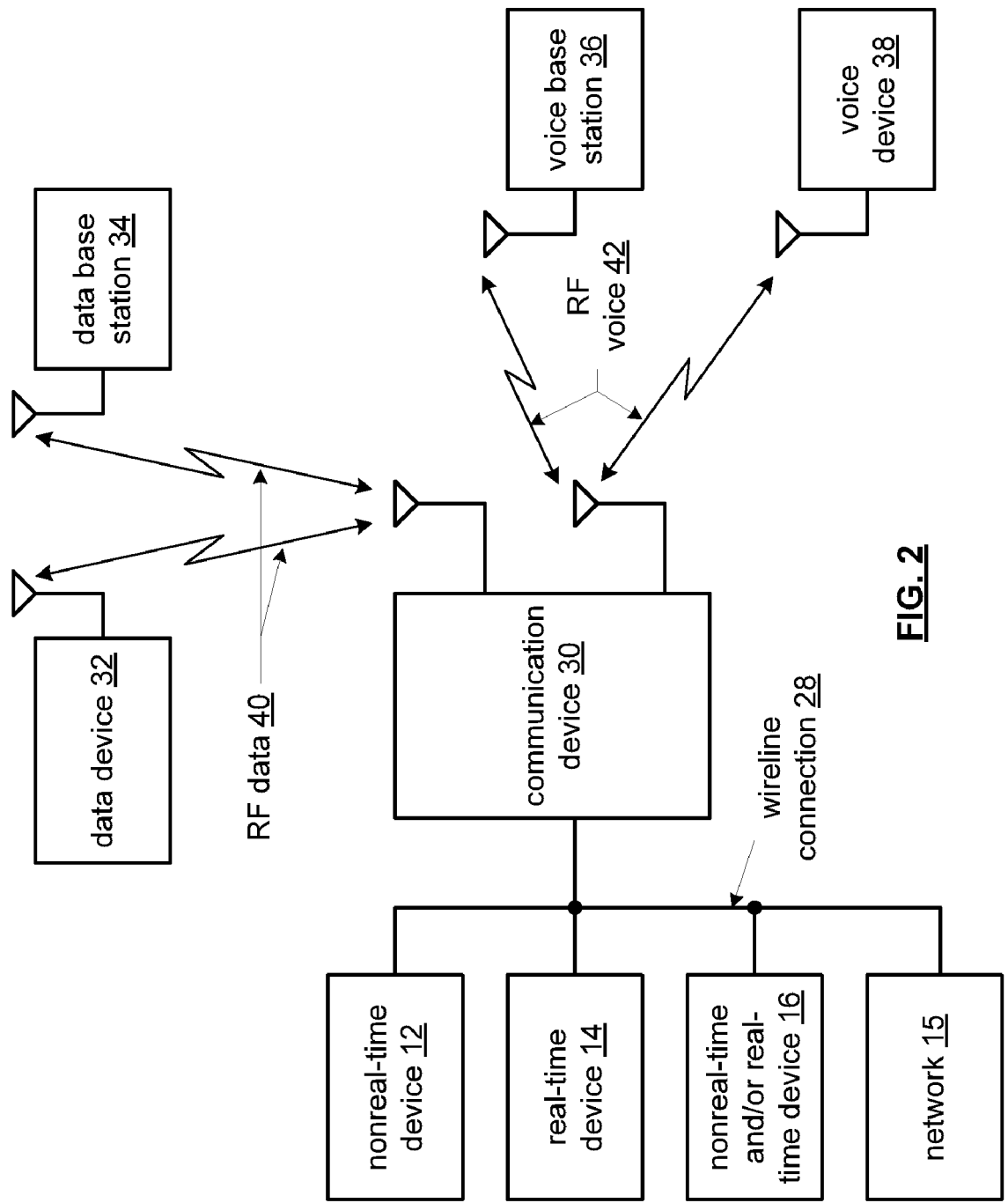
FIG. 2 is a schematic block diagram of another embodiment of a wireless communication system in accordance with the present invention.

FIG. 2 is a schematic block diagram of an embodiment of another communication system in accordance with the present invention. In particular, FIG. 2 presents a communication system that includes many common elements of FIG. 1 that are referred to by common reference numerals. Communication device 30 is similar to communication device 10 and is capable of any of the applications, functions and features attributed to communication device 10, as discussed in conjunction with FIG. 1. However, communication device 30 includes two or more separate wireless transceivers for communicating, contemporaneously, via two or more wireless communication protocols with data device 32 and/or data base station 34 via RF data 40 and voice base station 36 and/or voice device 38 via RF voice signals 42.

Figure 3:
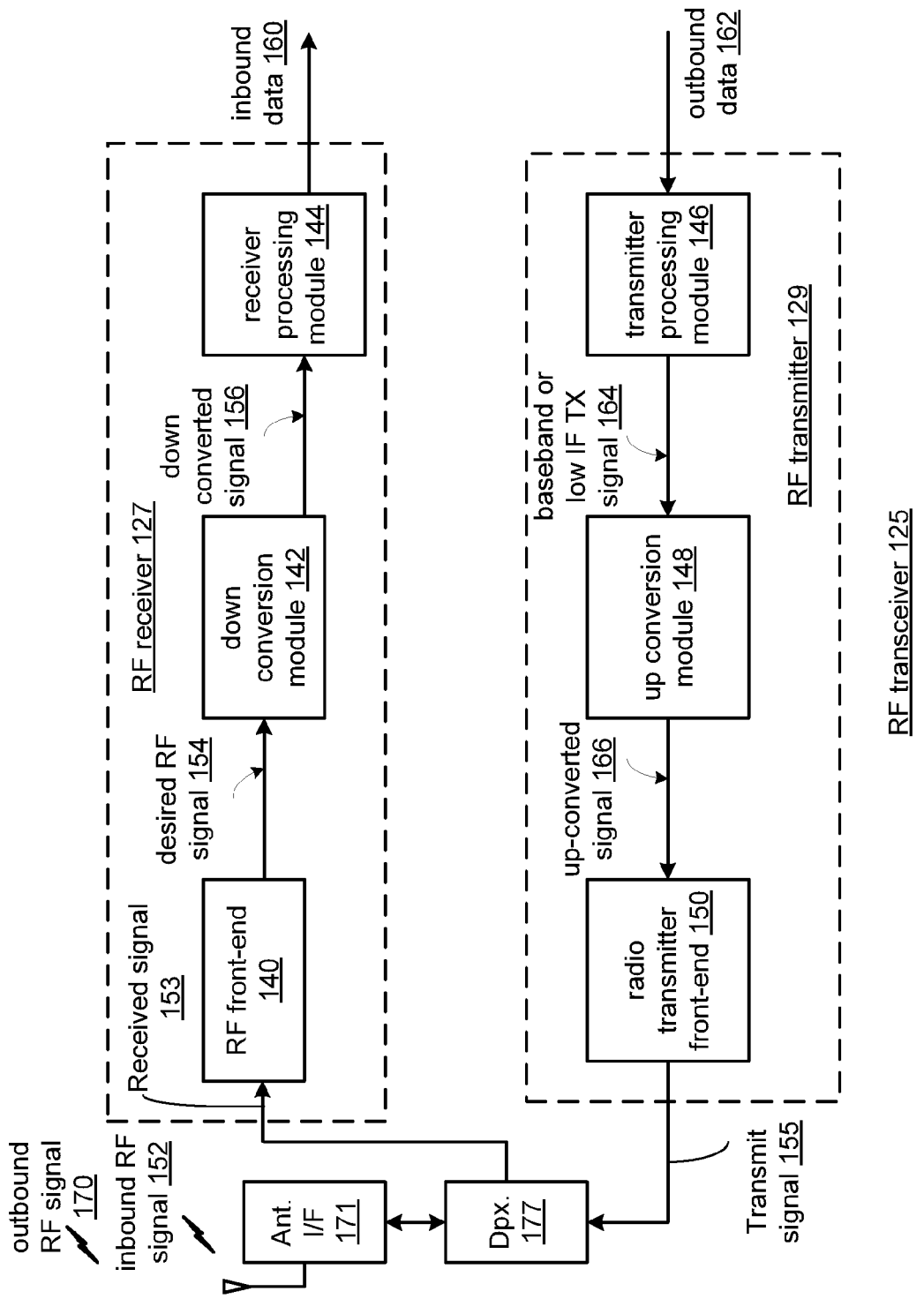
FIG. 3 is a schematic block diagram of an embodiment of a wireless transceiver 125 in accordance with the present invention.

FIG. 3 is a schematic block diagram of an embodiment of a wireless transceiver 125 in accordance with the present invention. The RF transceiver 125 represents a wireless transceiver for use in conjunction with communication devices 10 or 30, base station 18, non-real-time device 20, real-time device 22, and non-real-time, real-time device 25, data device 32 and/or data base station 34, and voice base station 36 and/or voice device 38. RF transceiver 125 includes an RF transmitter 129, and an RF receiver 127. The RF receiver 127 includes a RF front end 140, a down conversion module 142 and a receiver processing module 144. The RF transmitter 129 includes a transmitter processing module 146, an up conversion module 148, and a radio transmitter front-end 150.

As shown, the receiver and transmitter are each coupled to an antenna through an antenna interface 171 and a diplexer (duplexer) 177, that couples the transmit signal 155 to the antenna to produce outbound RF signal 170 and couples inbound signal 152 to produce received signal 153. Alternatively, a transmit/receive switch can be used in place of diplexer 177. While a single antenna is represented, the receiver and transmitter may share a multiple antenna structure that includes two or more antennas. In another embodiment, the receiver and transmitter may share a multiple input multiple output (MIMO) antenna structure, diversity antenna structure, phased array or other controllable antenna structure that includes a plurality of antennas and other RF transceivers similar to RF transceiver 125. Each of these antennas may be fixed, programmable, and antenna array or other antenna configuration. Also, the antenna structure of the wireless transceiver may depend on the particular standard(s) to which the wireless transceiver is compliant and the applications thereof.

In operation, the RF transmitter 129 receives outbound data 162. The transmitter processing module 146 packetizes outbound data 162 in accordance with a millimeter wave protocol or wireless telephony protocol, either standard or proprietary, to produce baseband or low intermediate frequency (IF) transmit (TX) signals 164 that includes an outbound symbol stream that contains outbound data 162. The baseband or low IF TX signals 164 may be digital baseband signals (e.g., have a zero IF) or digital low IF signals, where the low IF typically will be in a frequency range of one hundred kilohertz to a few megahertz. Note that the processing performed by the transmitter processing module 146 can include, but is not limited to, scrambling, encoding, puncturing, mapping, modulation, and/or digital baseband to IF conversion.

The up conversion module 148 includes a digital-to-analog conversion (DAC) module, a filtering and/or gain module, and a mixing section. The DAC module converts the baseband or low IF TX signals 164 from the digital domain to the analog domain. The filtering and/or gain module filters and/or adjusts the gain of the analog signals prior to providing it to the mixing section. The mixing section converts the analog baseband or low IF signals into up-converted signals 166 based on a transmitter local oscillation.

The radio transmitter front end 150 includes a power amplifier and may also include a transmit filter module. The power amplifier amplifies the up-converted signals 166 to produce outbound RF signals 170, which may be filtered by the transmitter filter module, if included. The antenna structure transmits the outbound RF signals 170 via an antenna interface 171 coupled to an antenna that provides impedance matching and optional bandpass filtration.

The RF receiver 127 receives inbound RF signals 152 via the antenna and antenna interface 171 that operates to process the inbound RF signal 152 into received signal 153 for the receiver front-end 140. In general, antenna interface 171 provides impedance matching of antenna to the RF front-end 140, optional bandpass filtration of the inbound RF signal 152.

The down conversion module 142 includes a mixing section, an analog to digital conversion (ADC) module, and may also include a filtering and/or gain module. The mixing section converts the desired RF signal 154 into a down converted signal 156 that is based on a receiver local oscillation 158, such as an analog baseband or low IF signal. The ADC module converts the analog baseband or low IF signal into a digital baseband or low IF signal. The filtering and/or gain module high pass and/or low pass filters the digital baseband or low IF signal to produce a baseband or low IF signal 156 that includes a inbound symbol stream. Note that the ordering of the ADC module and filtering and/or gain module may be switched, such that the filtering and/or gain module is an analog module.

The receiver processing module 144 processes the baseband or low IF signal 156 in accordance with a millimeter wave protocol, either standard or proprietary to produce inbound data 160 such as probe data received from probe device 105 or devices 100 or 101. The processing performed by the receiver processing module 144 can include, but is not limited to, digital intermediate frequency to baseband conversion, demodulation, demapping, depuncturing, decoding, and/or descrambling.

In an embodiment of the present invention, receiver processing module 144 and transmitter processing module 146 can be implemented via use of a microprocessor, microcontroller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The associated memory may be a single memory device or a plurality of memory devices that are either on-chip or off-chip. Such a memory device may be a read-only memory, random access memory, volatile memory, non-volatile memory, static memory, dynamic memory, flash memory, and/or any device that stores digital information. Note that when the processing devices implement one or more of their functions via a state machine, analog circuitry, digital circuitry, and/or logic circuitry, the associated memory storing the corresponding operational instructions for this circuitry is embedded with the circuitry comprising the state machine, analog circuitry, digital circuitry, and/or logic circuitry.

While the processing module 144 and transmitter processing module 146 are shown separately, it should be understood that these elements could be implemented separately, together through the operation of one or more shared processing devices or in combination of separate and shared processing.

Further details including optional functions and features of the RF transceiver are discussed in conjunction with FIGS. 4-9 that follow.

Figure 4:
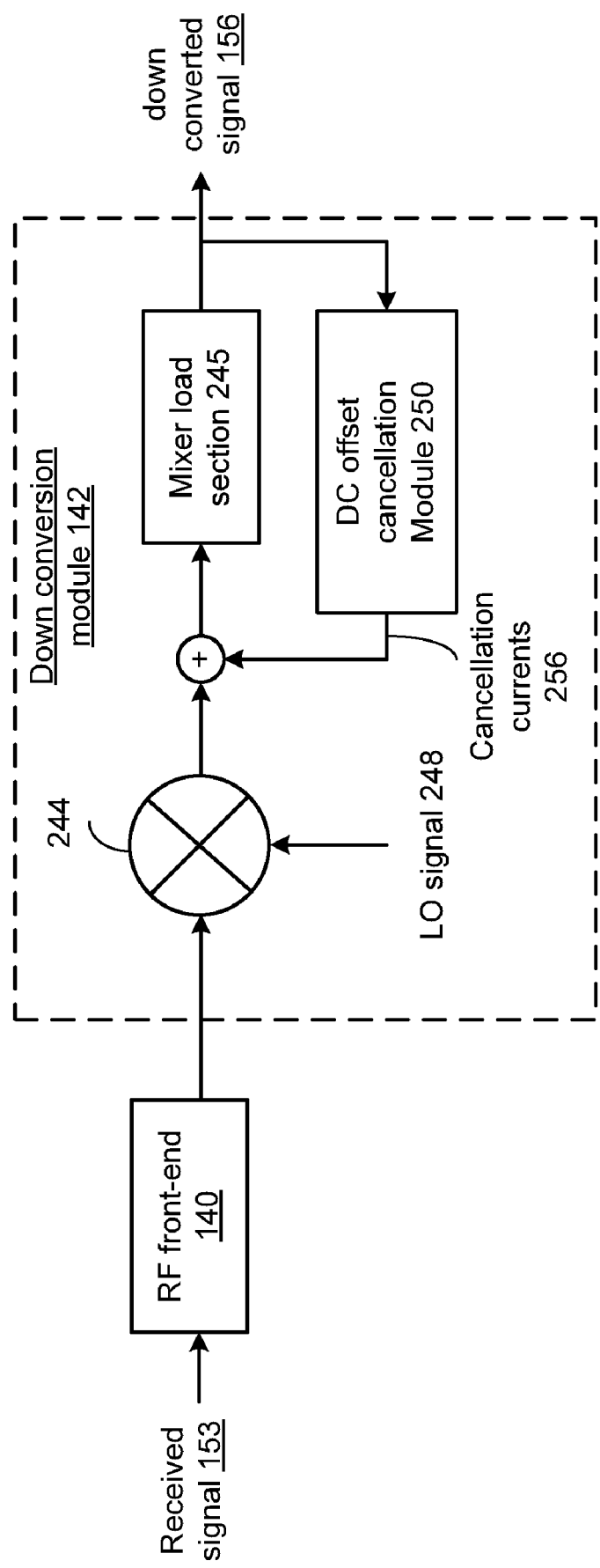
FIG. 4 is a schematic block diagram of an embodiment of a down conversion module 142 in accordance with the present invention.

FIG. 4 is a schematic block diagram of an embodiment of a down conversion module 142 in accordance with the present invention. Down conversion module 142 includes a mixer 244 operable to down convert an amplified receive signal from a low noise amplifier in RF front end 140, based on a local oscillation signal 248, to produce a mixer output signal. A mixer load section 245 is operable to produce a down converted signal 156 at the output of the mixer load section 245, based on the mixer output signal.

A direct current (DC) offset cancellation module 250 is operable to measure a DC offset at the output of the mixer load section 245, to generate cancellation currents 256 at the output of the mixer load section and to combine the cancellation currents 256 with the mixer output signal to provide DC offset cancellation.

DC offset cancellation module 250 can be implemented via hardware, such as transconductance circuit with AC filtration or other circuitry such as a processing device. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Further note that if the processing module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

Figure 5:
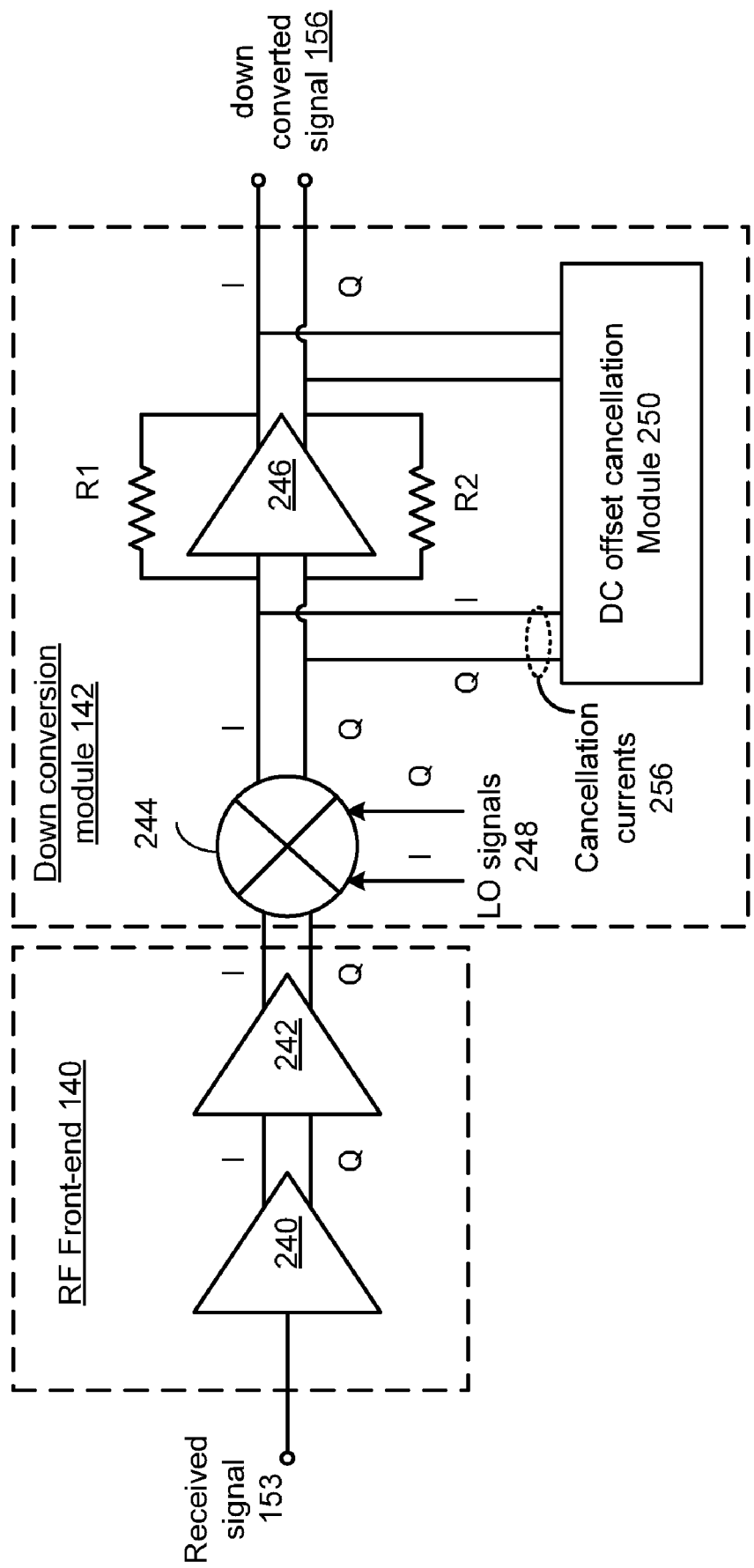
FIG. 5 is a schematic block diagram of an embodiment of a down conversion module 142 in accordance with the present invention.

FIG. 5 is a schematic block diagram of an embodiment of a down conversion module 142 in accordance with the present invention. In particular, a down conversion mixer with DC offset cancellation is presented for use in conjunction with a down conversion module such as down conversion module 142. Received signal 153 is processed by one or more adjustable gain LNA stages 240 and 242 of RF front end 140. A mixer 244 operates based on local oscillator (LO) signals 248 to down convert the received signal to baseband or low IF. A transimpedance amplifier 246 generates the down converted signal output 156. A large DC offset may be present at the output of transimpedance amplifier 246, due to the self-mixing of the LO and LO leakage at the received signal 153 which is amplified by LNAs 240 and 242 before the mixer 244.

DC offset cancellation module 250 measures the DC offset at the mixer load outputs, the outputs of transimpedance amplifier 246 and injects cancellation currents 256 opposite in polarity to the LO self-mixing DC currents, such that the mixer load is essentially free of any DC offset. The DC offset cancellation module 250 compensates for DC offsets caused by high LO leakage, high LNA(s) gain, and/or high mixer gain, thereby achieving better receiver noise figure (i.e. better receiver sensitivity).

As indicated, the amplified receive signal from the LNAs 240 and 242, the output signal from mixer 244, the local oscillator signals 248, the down converted signal 156 and the cancellation currents 256 are each mixed signals having a quadrature component and an in-phase component.

Figure 6:
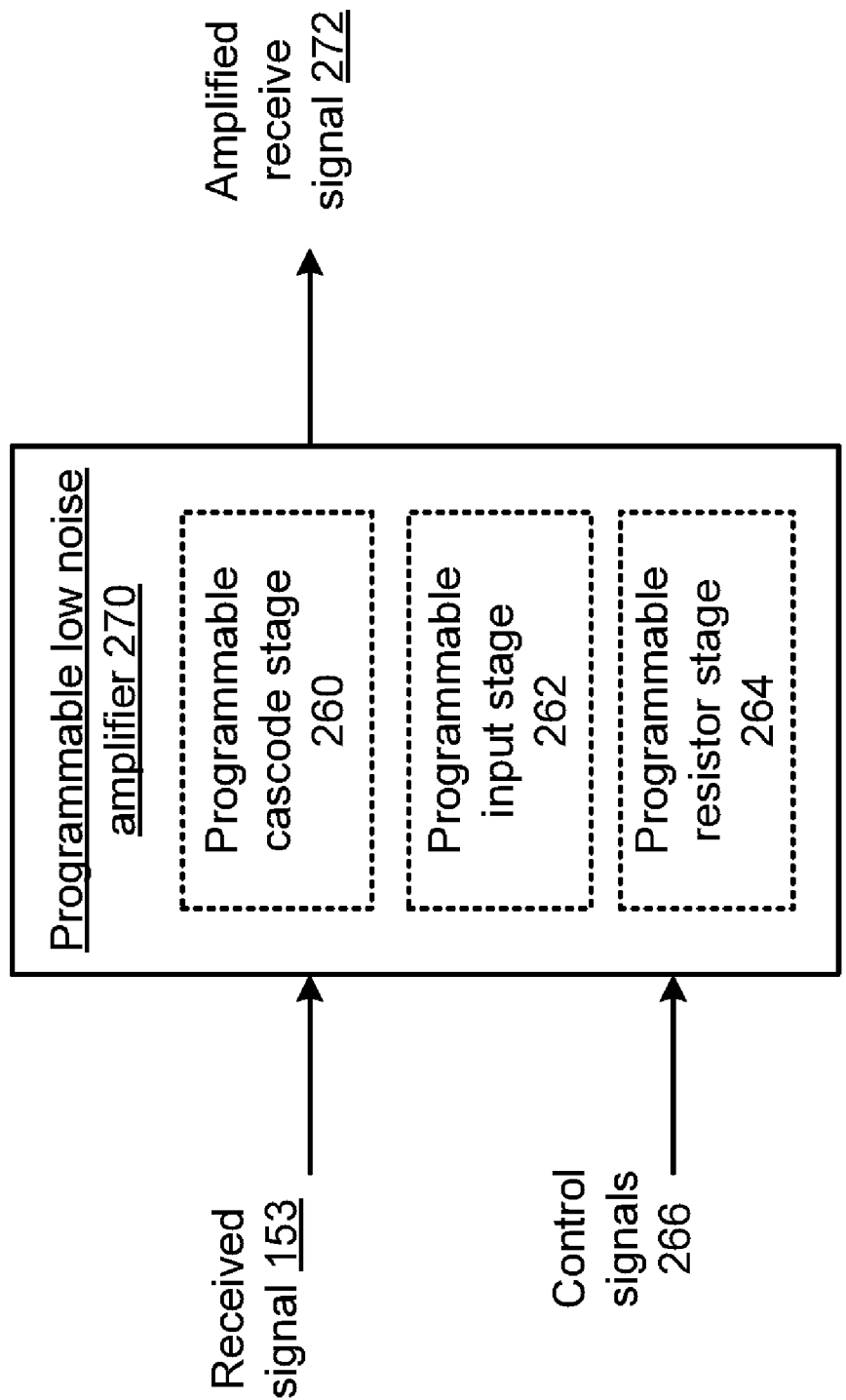
FIG. 6 is a schematic block diagram of an embodiment of a low noise amplifier in accordance with the present invention.

FIG. 6 is a schematic block diagram of an embodiment of a low noise amplifier in accordance with the present invention. A programmable low noise amplifier 270, such as a low noise amplifier of RF front end 140, is presented that generates an amplified received signal 272 from a received signal 153. A programmable input stage has a first gain is programmable based on a first control signal of control signals 266. A programmable cascode stage having a second gain is programmable based on a second control signal of control signals 266. A programmable resistor stage controls the quality of a resonant tank circuit, based on a third control signal.

Figure 7:
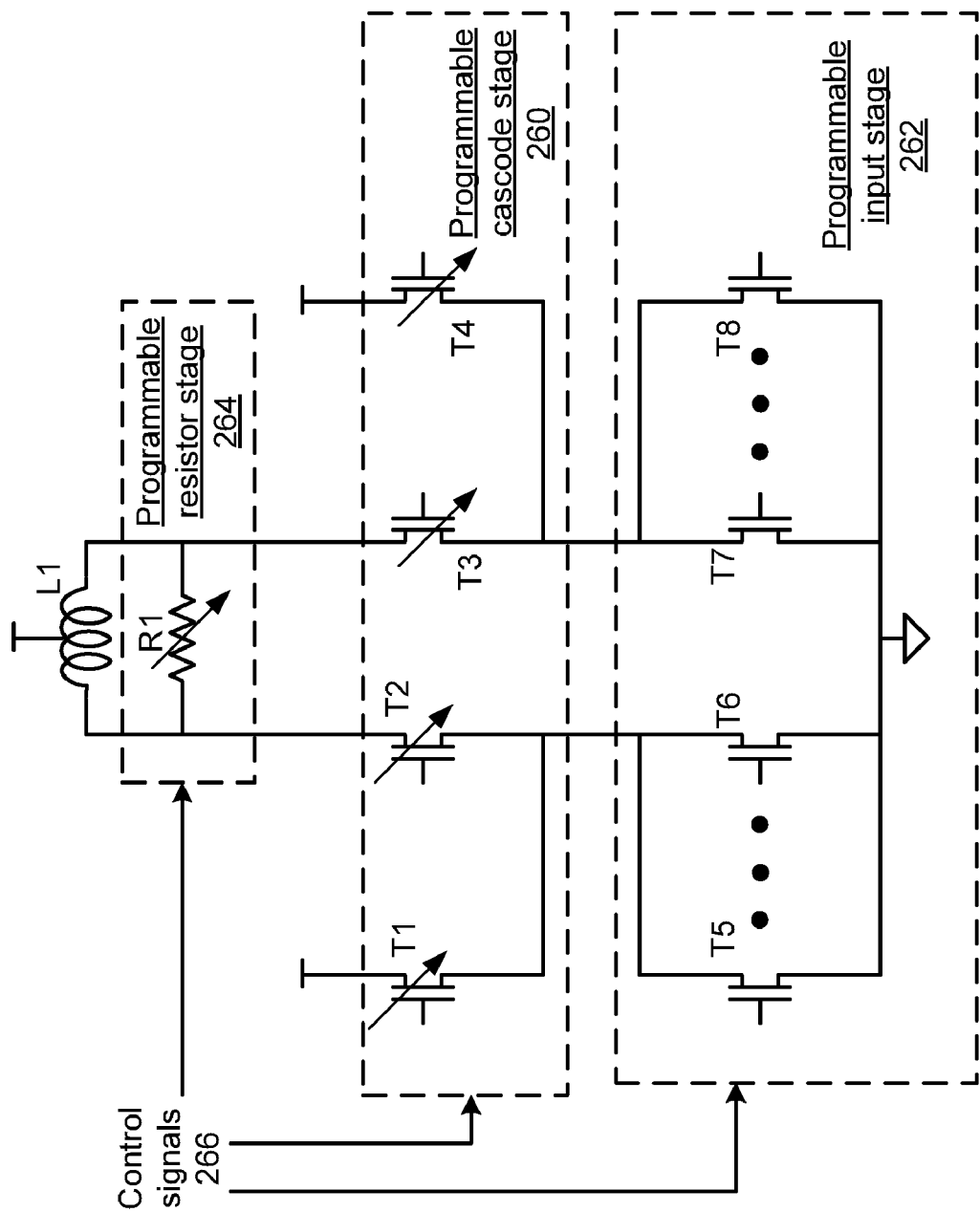
FIG. 7 is a schematic block diagram of an embodiment of a low noise amplifier in accordance with the present invention.

FIG. 7 is a schematic block diagram of an embodiment of a low noise amplifier in accordance with the present invention. A low noise amplifier (LNA), such as low noise amplifiers 210, 240 or 242 is presented with multiple mode gain controls that allows more flexibility in terms of supply current consumption, lower noise degradation at low gain, and preserved selectivity of the output LC tank. A programmable input stage 262 includes transistors T5, T6, T7 and T8 that can be selectively turned off or turned on in response to control signals 266 to allow lower gain and lower current consumption simultaneously. A programmable cascode stage 260 includes transistors T1, T2, T3, and T4 that are programmable, based on control signals 266, to adjust the gain with predictable gain steps. This can preserve output LC tank selectivity, albeit with potentially degraded noise at lower gain. A programmable output resistor R1 is programmable based on control signals 266 to control the quality of the resonant tank circuit formed in conjunction with the inductor L1. This allows lower gain with minimal noise degradation. The degraded output LC tank selectivity is not an issue, for example, with close-in receiver interferers. The programmable resistor can be implemented via a switched resistor circuit, a plurality of fixed resistors that are either combined in series and parallel or selectively coupled or uncoupled based on a programmable switching network, or via other adjustable resistor configuration.

Figure 8:
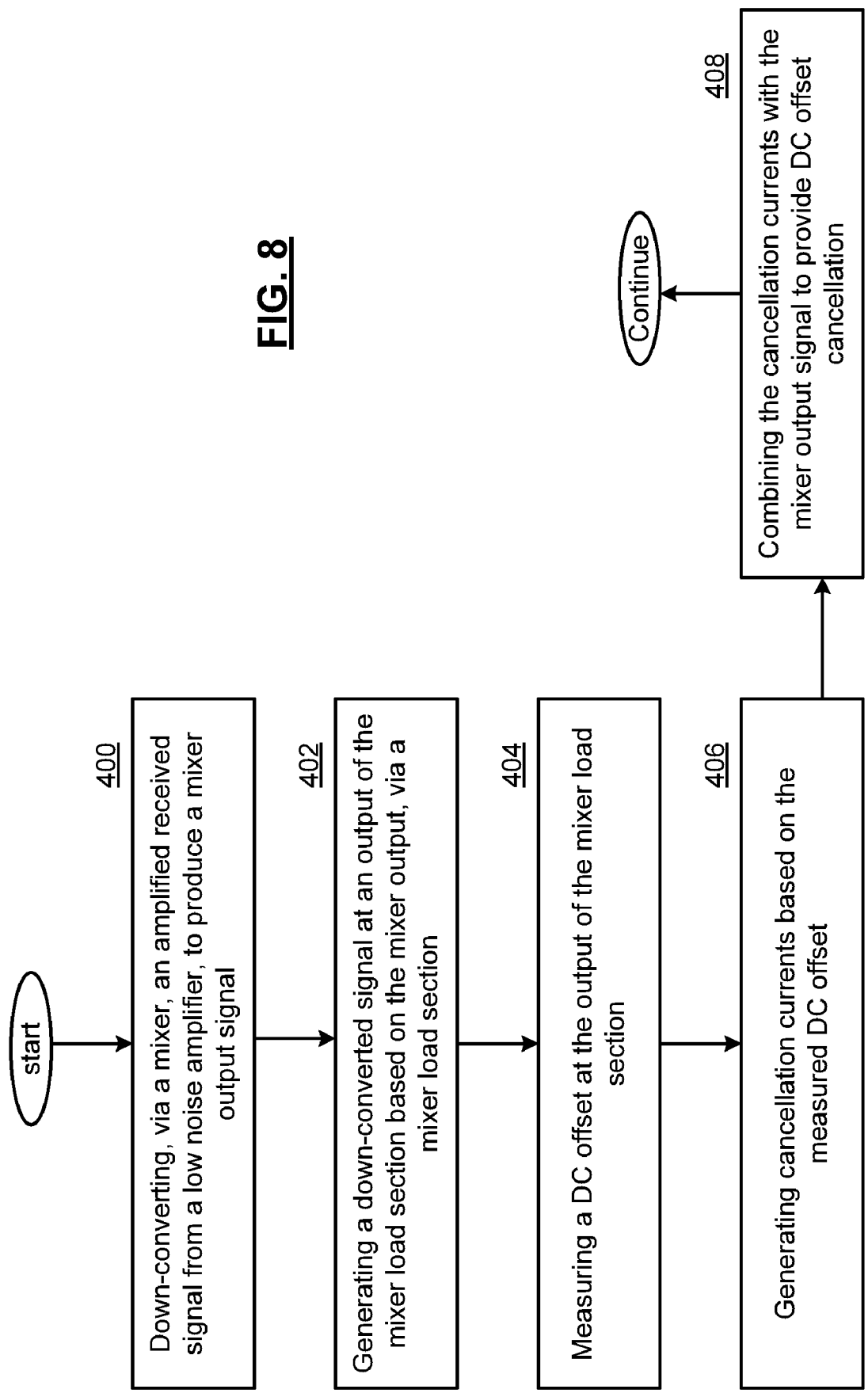
FIG. 8 is a flow diagram of an embodiment of a method in accordance with the present invention.

FIG. 8 is a flow diagram of an embodiment of a method in accordance with the present invention. In particular, a method is presented for use in conjunction with one or more functions and features described in conjunction with FIGS. 1-5. In step 400, an amplified receive signal from a low noise amplifier is down converted, via a mixer and based on a local oscillation, to produce a mixer output signal. In step 402, a down converted signal is generated at an output of the mixer load section based on the mixer output, via a mixer load section. In step 404, a (direct current) DC offset is measured at the output of the mixer load section. In step 406, cancellation currents are generated. In step 408, the cancellation currents are combined with the mixer output signal to provide DC offset cancellation.

In an embodiment of the present invention, the mixer load section includes a transimpedance amplifier. The mixer load section can include a transimpedance amplifier. The amplified receive signal and the mixer output signal can be each mixed signals having a quadrature component and an in-phase component. The local oscillation, the output of the mixer load section and the cancellation currents can each include a quadrature component and an in-phase component.

Figure 9:
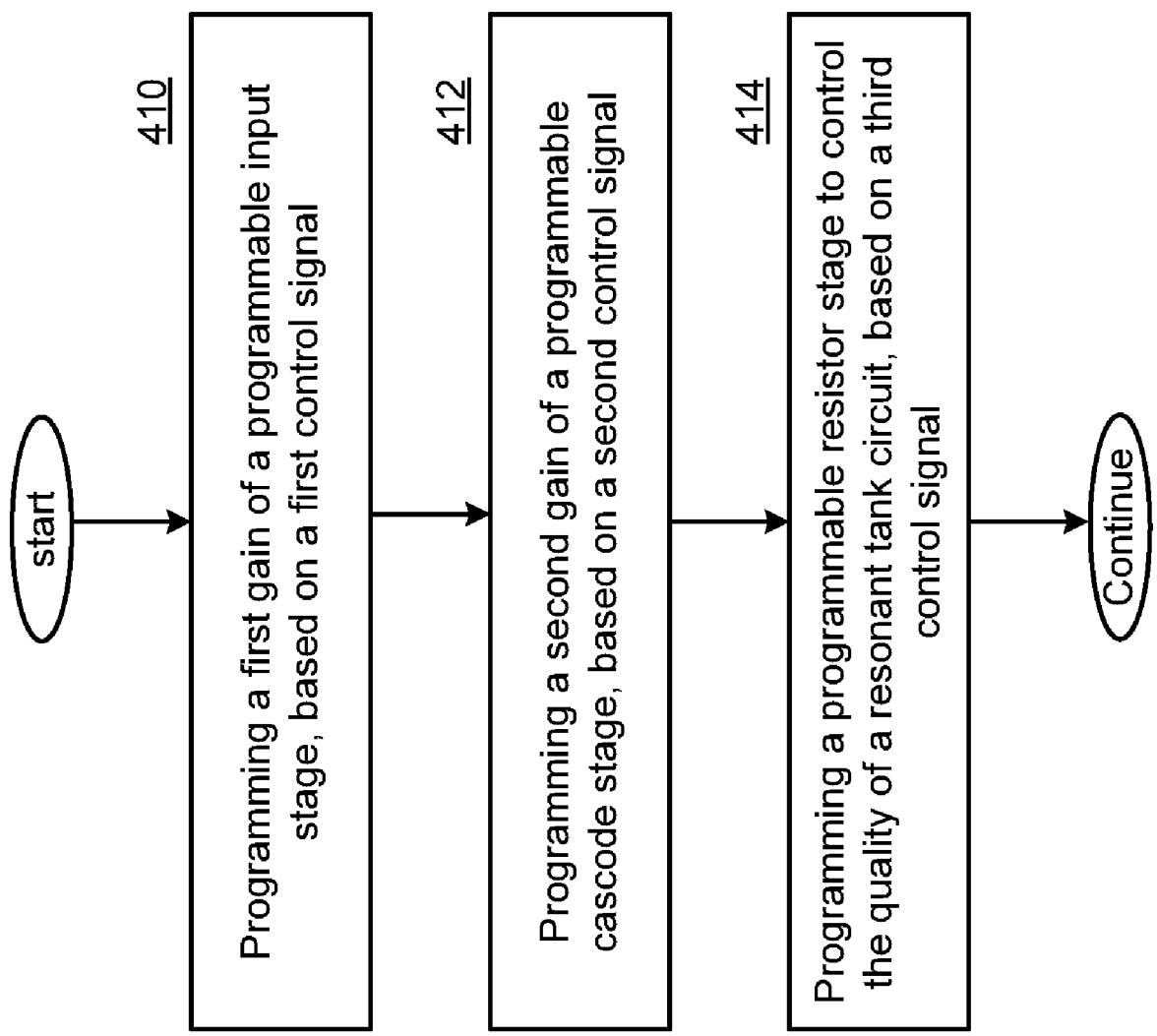
FIG. 9 is a flow diagram of an embodiment of a method in accordance with the present invention.

FIG. 9 is a flow diagram of an embodiment of a method in accordance with the present invention. In particular, a method is presented for use in conjunction with one or more functions and features described in conjunction with FIGS. 1-6. In step 410, a first gain of a programmable input stage, is programmed based on a first control signal. In step 412, a second gain of a programmable cascode stage, is programmed based on a second control signal. In step 414, a programmable resistor stage is programmed to control the quality of a resonant tank circuit, based on a third control signal.

The resonant tank circuit can includes at least one inductor. The programmable cascode stage can include a plurality of transistors having individual gains that are programmable based on the second control signal. The individual gains can be programmable based on the second control signal to a plurality of discrete gain steps. The programmable input stage can include a plurality of transistors that are selectively turned on based on the first control signal. The programmable input stage includes a plurality of transistors that can be selectively turned on or off based on the first control signal.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "operably coupled to", "coupled to", and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

As may also be used herein, the terms "processing module", "processing circuit", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

The present invention has been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

The present invention may have also been described, at least in part, in terms of one or more embodiments. An embodiment of the present invention is used herein to illustrate the present invention, an aspect thereof, a feature thereof, a concept thereof, and/or an example thereof. A physical embodiment of an apparatus, an article of manufacture, a machine, and/or of a process that embodies the present invention may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

While the transistors in the above described figure(s) is/are shown as field effect transistors (FETs), as one of ordinary skill in the art will appreciate, the transistors may be implemented using any type of transistor structure including, but not limited to, bipolar, metal oxide semiconductor field effect transistors (MOSFET), N-well transistors, P-well transistors, enhancement mode, depletion mode, and zero voltage threshold (VT) transistors.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path.

While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of the various embodiments of the present invention. A module includes a processing module, a functional block, hardware, and/or software stored on memory for performing one or more functions as may be described herein. Note that, if the module is implemented via hardware, the hardware may operate independently and/or in conjunction software and/or firmware. As used herein, a module may contain one or more sub-modules, each of which may be one or more modules.

While particular combinations of various functions and features of the present invention have been expressly described herein, other combinations of these features and functions are likewise possible. The present invention is not limited by the particular examples disclosed herein and expressly incorporates these other combinations.

What is claimed is:

1. A low noise amplifier that generates an amplified received signal from a received signal, the low noise amplifier comprising:
   a programmable input stage, having a first gain that is programmable based on a first control signal;
   a programmable cascode stage, coupled to the programmable input stage, having a second gain that is programmable based on a second control signal; and
   a programmable resistor stage, coupled to the programmable cascode stage, that control a quality of a resonant tank circuit, based on a third control signal.

2. The low noise amplifier of claim 1, wherein the resonant tank circuit includes at least one inductor.

3. The low noise amplifier of claim 1, wherein the programmable cascode stage includes a plurality of transistors having individual gains that are programmable based on the second control signal.

4. The low noise amplifier of claim 3, wherein the individual gains are programmable based on the second control signal to a plurality of discrete gain steps.

5. The low noise amplifier of claim 1, wherein the programmable input stage includes a plurality of transistors that are selectively turned on based on the first control signal.

6. The low noise amplifier of claim 1, wherein the programmable input stage includes a plurality of transistors that are selectively turned off based on the first control signal.

7. A method for use in a low noise amplifier, the method comprising:
   programming a first gain of a programmable input stage, based on a first control signal;
   programming a second gain of a programmable cascode stage, based on a second control signal; and
   programming a programmable resistor stage to control a quality of a resonant tank circuit, based on a third control signal.

8. The method of claim 7, wherein the resonant tank circuit includes at least one inductor.

9. The method of claim 7, wherein the programmable cascode stage includes a plurality of transistors having individual gains that are programmable based on the second control signal.

10. The method of claim 9, wherein the individual gains are programmable based on the second control signal to a plurality of discrete gain steps.

11. The method of claim 7, wherein the programmable input stage includes a plurality of transistors that are selectively turned on based on the first control signal.

12. The method of claim 7, wherein the programmable input stage includes a plurality of transistors that are selectively turned off based on the first control signal.

\* \* \* \* \*